United States Patent
Muto et al.

(10) Patent No.: US 6,187,452 B1
(45) Date of Patent: Feb. 13, 2001

(54) ULTRATHIN STAINLESS STEEL FOIL

(75) Inventors: Izumi Muto; Michio Nakata; Yoshihiro Fujii; Kenji Hirashima; Shuji Nagasaki, all of Hikari; Jun Nakatsuka, Tokyo; Tsuyoshi Nakano, Hikari, all of (JP)

(73) Assignee: Nippon Steel Corporation, Tokyo (JP)

(*) Notice: Under 35 U.S.C. 154(b), the term of this patent shall be extended for 0 days.

(21) Appl. No.: 09/528,520

(22) Filed: Mar. 20, 2000

(30) Foreign Application Priority Data

Mar. 23, 1999 (JP) .................................................. 11-077146

(51) Int. Cl.[7] .................................................. C22C 38/40
(52) U.S. Cl. .................................................. 428/606; 148/327
(58) Field of Search .......................... 428/606; 148/325, 148/327

(56) References Cited

U.S. PATENT DOCUMENTS 5,045,404 * 9/1991 Ohmura et al. ........................ 428/606
5,286,442 * 2/1994 Uematsu et al. ........................ 420/40
5,332,544 * 7/1994 Uematsu et al. ........................ 420/40

FOREIGN PATENT DOCUMENTS 1-309919 * 12/1989 (JP) .
3-61322 * 3/1991 (JP) .

* cited by examiner

Primary Examiner—John J. Zimmerman
(74) Attorney, Agent, or Firm—Kenyon & Kenyon

(57) ABSTRACT

An ultrathin stainless steel foil of a thickness of 25 $\mu$m or less whose average number of inclusions of a major diameter of 5 $\mu$m or greater per 1 $mm^2$ in sections along the rolling direction is 3 or less. The ultrathin stainless steel foil is not readily susceptible to the local tunnel-like corrosions (voids) that have occasionally occurred, during etching, together with cracking in the rolling direction from the edges.

5 Claims, 5 Drawing Sheets

ULTRATHIN STAINLESS STEEL FOIL

BACKGROUND OF THE INVENTION

1. Field of the Invention

This invention relates to an ultrathin stainless steel foil suitable for etching, more particularly to a stainless steel foil that is not readily susceptible to the voids (tunnel-like erosions) that have occasionally occurred during etching together with cracking in the rolling direction from the edges. Fields in which the stainless steel foil of the present invention are utilizable include machine components (precision microsprings, precision vibrator plates, printer types, cutting dies etc.) and electronic equipment components (hard disk suspensions, printed circuit boards, picture tube shadow masks, lead frames etc.)

2. Description of the Related Art

Etching is extensively applied industrially in the precision processing of metal materials for electronic equipment. It is an indispensable production technology particularly for hard disk suspensions, printed circuit boards, picture tube shadow masks, IC lead frames and the like. Moreover, the push toward miniaturization, lighter weight and longer service life in electronic equipment of recent years is expanding applications for stainless steel foils, especially ultrathin foils of steels excellent in corrosion resistance of thickness on the order of 20 $\mu$m.

In current industrially utilized etching methods, the technique used to increase production efficiency is generally to conduct product shaping by dissolving the metal in an aqueous solution having highly corrosive ferric chloride ($FeCl_3$) as main component. Specifically, the front and rear surfaces of the foil are formed with photoresist films only at the portions of the steel to be left undissolved and the unneeded portions are dissolved by spraying with the etchant.

From the technical viewpoint, the important point in this technology is to achieve uniform dissolution over the entire surface and to accurately dissolve the foil along the contour of the photoresist film. Particularly when making a very small component from ultrathin stainless steel foil, the occurrence of voids or cracks from the edges degrades the strength of fine portions to the point that they break during bending or other such working, or during use of the equipment in which they are used. As electronic equipment is required to have high reliability, fine voids and/or cracks are extremely harmful defects that degrade the service life and reliability of the equipment as a whole. Even a microscopic void or crack measuring only several tens of $\mu$m in length can be a fatal defect in the case of an ultrathin foil of around 20 $\mu$m thickness.

It has been pointed out that shaping imperfections occur during etching because of lack of metal structure uniformity and presence of component segregations and nonmetallic inclusions. In particular, it is known that nonmetallic inclusions become void starting points and that to minimize them is effective for improving product dimensional precision. Japanese Unexamined Patent Publication No. 60(1985)-92449 teaches control of the number of pits produced by etching to 30 pits/15 $mm^2$ by using a martensitic stainless steel for etching that satisfies the relationship of (S ppm) <42−0.094 (O ppm), where S and O contents (mass) are expressed in ppm units. This reflects the fact that to prevent dissolution of inclusion it is necessary to regulate the amount of sulfide inclusions in proportion to the amount of oxygen because soluble sulfides like MnS readily precipitate with oxide inclusions as nuclei.

This technique of avoiding shaping defects by reducing sulfide inclusions has also been applied to ordinary steels. Japanese Unexamined Patent Publication No. 60(1985)-103153 teaches a quenched and annealed carbon steel having an S content of 0.004 wt %, while Japanese Unexamined Patent Publication No. 7(1995)-268541 teaches an ordinary steel regulated to a content of S, an impurity, of 0.002 wt %.

In the case of recent ultrathin stainless steel foils of a thickness on the order of 20 $\mu$m, however, restriction of S and/or O to the aforesaid ranges of the prior art does not enable avoidance of voids and/or cracks extending in the rolling direction from the edges formed by etching.

In the prior art examples, the local corrosion during etching produces etching pits, hemispherical recesses, craters and other such depressions that are smaller in depth than the opening width. In the case of ultrathin foil, however, the local corrosion produces tunnel-like voids that are 2–5 $\mu$m in inside diameter and extend to a length of more than 10 $\mu$m in the rolling direction. This is a different phenomenon for which no solution has been known.

SUMMARY OF THE INVENTION

The present invention was accomplished to overcome the problem discussed in the foregoing and relates to an ultrathin stainless steel foil that is not readily susceptible to occurrence of voids and/or cracking during etching, more specifically to a stainless steel foil that is not readily susceptible to the voids (tunnel-like corrosions) that have occasionally occurred in the rolling direction from the edges during etching.

In order to achieve this object, the inventor conducted research on a broad range of subjects including stainless steel composition, foil thickness and nonmetallic inclusion cleanliness. As a result, he discovered that even in the case of a very thin foil seriously affected even by light corrosion, voids and cracks can be avoided by appropriately controlling the composition and cleanliness of the steel. The gist of the present invention is as follows:

(1) An ultrathin stainless steel foil of a thickness of 25 $\mu$m or less whose average number of inclusions of a major diameter of 5 $\mu$m or greater per 1 $mm^2$ in sections along the rolling direction is 3 or less.

(2) An ultrathin stainless steel foil according to (1) above, wherein proximity between the inclusions of a major diameter of 5 $\mu$m or greater is 0.3 mm or greater.

(3) An ultrathin stainless steel foil of a thickness of 25 $\mu$m or less according to (1) or (2) above, wherein the ultrathin stainless steel foil comprises, in wt %, 5% to 30% of Ni and 0.0030% or less of S as an impurity, and has cleanliness, as defined by JIS G 0555, of 0.005% or less.

(4) An ultrathin stainless steel foil according to (3) above, further comprising, in wt %, 0.0030% or less of Al.

(5) An ultrathin stainless steel foil according to (3) or (4) above, further comprising, in wt %, one or more of 0.15% to 4% of Cu, 0.05% to 2% of Ti, 0.3% to 6.5% of Mo, 0.3% to 6.5% or W and 0.3% to 6.5% of V.

DESCRIPTION OF THE PREFERRED EMBODIMENT

Figure 1:
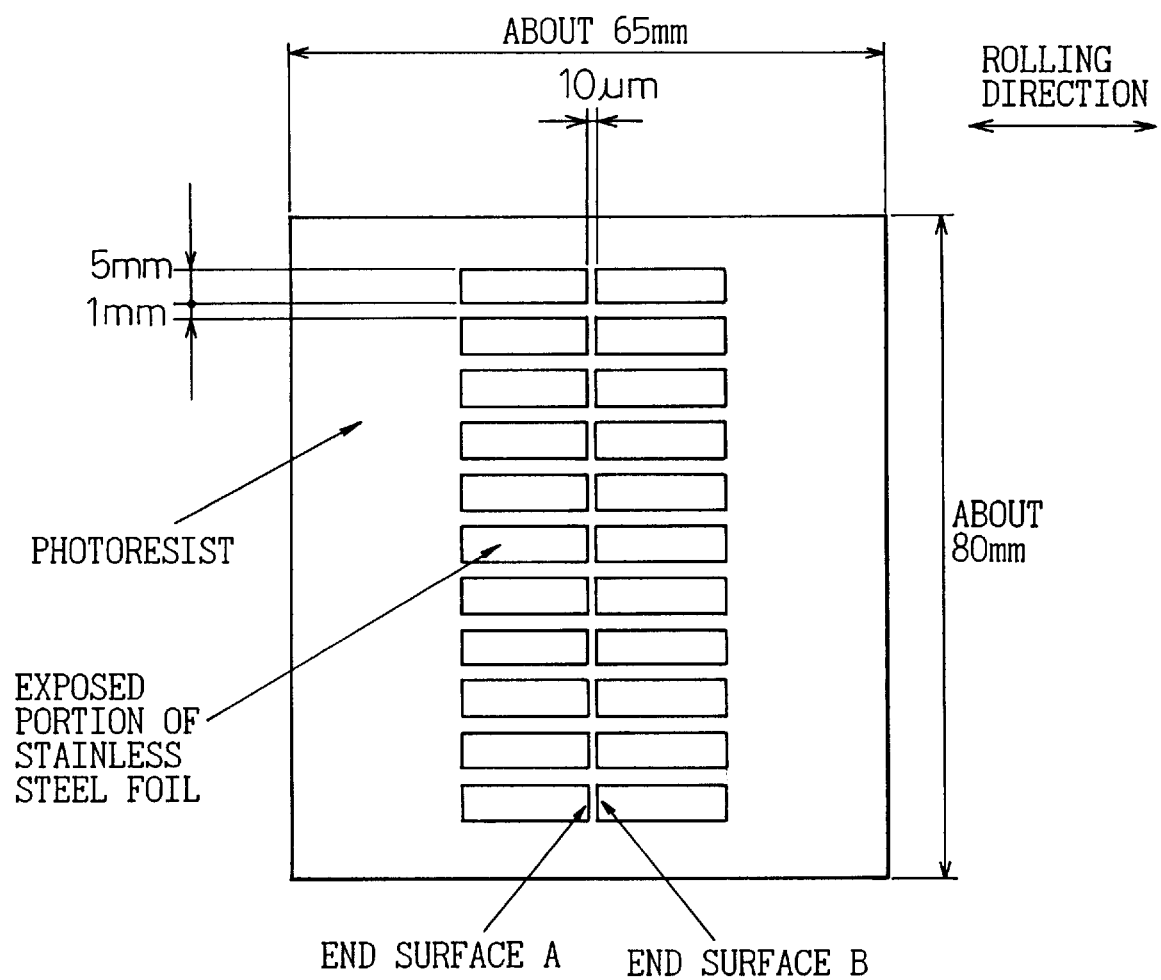
FIG. 1 is a diagram showing the shape and dimensions of test pieces for etching.

The reason for the limits defined by the present invention will now be explained.

The thickness of the foil is limited to 25 μm or less. When the thickness is greater than 25 μm, the reduction ratio is relatively low, so that portions lacking uniformity of metal structure or composition and portions dense in nonmetallic inclusions are drawn only to a short length, if at all. Since local corrosions have openings of a relatively large inner diameter, moreover, they do not develop into voids (which in some cases would be tunnel-like local corrosions accompanied by cracking). Therefore, a cold-rolled sheet of stainless steel of ordinary chemical composition and cleanliness of a thickness greater than 25 μm is suitable for use after foil rolling. Conversely, restriction of the steel composition and/or cleanliness as set out below only increases production cost. On the other hand, when the foil thickness is 25 μm or less, portions lacking uniformity of metal structure or composition, portions dense in nonmetallic inclusions, and the like are drawn to a great length proportional to the higher reduction ratio. Unless the chemical composition and cleanliness of the steel are specially controlled, voids and cracks are apt to occur. The thickness of the foil of the present invention is therefore limited to 25 μm or less.

The average number of large inclusions having a major diameter of 5 μm or greater per 1 $mm^2$ in sections along the rolling direction must be made 3 or less. Large inclusions may themselves not be dissolved by the etchant but they are likely to drop out owing to preferential dissolution of MnS and S-rich metal portions, which tend to deposit around the inclusions, or of the inclusion/matrix interface. These localities become starting points for local corrosion. When the density of such large inclusions (number/$mm^2$) is high, the holes caused by inclusion dropout readily interconnect to form voids (tunnel-like corrosions). Although large inclusions are not a concern in isolation, ones of greater than a certain size become a problem when present in large numbers. The density of inclusions of a major diameter of 5 μm or greater is therefore limited to 3/$mm^2$.

Voids grow mostly in the rolling direction since the structure of the rolled metal foil is markedly drawn out in this direction. When the number of inclusions is greater in sections parallel to the rolling direction than in sections perpendicular to the rolling direction, the corrosions more readily become tunnel-like and elongated and therefore harmful. The inclusion density (number/$mm^2$) is therefore defined as density in sections determined in the direction of rolling.

To the limitation of inclusion density is added the limitation of inclusion proximity to 0.3 mm or greater. By this, voids can be very greatly reduced. As pointed out above, the primary reason for void occurrence is that dissolution starting from one inclusion continues on to adjacent ones. Voids can therefore be effectively avoided by increasing the proximity among the inclusions. The proximity of inclusions is therefore limited to 0.3 mm or greater.

The present invention does not particularly define the method for achieving the prescribed inclusion density (number/$mm^2$) and proximity. It is sufficient to carry out, in combination, measures such as blowing in an inert gas or the like to promote inclusion flotation after refining, reducing the amount of slag entrained by the steel, and regulating the period between refinement and casting so as to suppress generation of large oxide-system inclusions.

Ni suppresses void generation. Occurrence of voids can be prevented by combining Ni addition with S reduction. The lower limit of Ni addition is defined as 5.0% because its effect is weak at a low content. The effect of Ni tends to saturate with increasing addition. The upper limit of Ni is therefore set at 35% because at higher content the increase in effect is small relative to the increase in cost.

Sulfur contained in stainless steel as an impurity promotes void generation by forming S-rich regions and locations rich in sulfide inclusions such as MnS. To avoid this type of corrosion, the S content must be reduced to 0.0030% or less. A steel having a S content of this level can sometimes be obtained using an ordinary stainless steel refining method. For stable industrial production at high yield, however, it is necessary to adopt some special measure, for example, to use low S starting materials and/or increase basicity.

In order to prevent voids without limiting the stainless steel composition, it is necessary to strictly regulate the distribution state of large inclusions of a major diameter of 5 μm or greater. When regulating the content of Ni, S and the like, however, mere regulation of inclusion cleanliness is insufficient. In such a case, reduction of significant local corrosions in the processed foil product of 25 μm or smaller thickness requires the nonmetallic inclusion cleanliness to be controlled to 0.005% or less. Cleanliness here is the total of A-system, B-system and C-system inclusions measured by the method prescribed by JIS G 0555 and is defined as the value d(%) of the following equation:

$$d=(n/(p \cdot f)) \cdot 100$$

where p is the number of lattice points within the field of view, f is the number of fields of view, and n is the number of lattice point centers occupied by all inclusions in f number of fields. (Based on test results obtained by observing 60 fields of a section parallel to the rolled foil surface at magnification of 400.)

When a processed ultrathin stainless steel foil product experiences voids despite reduction of S, an impurity, addition of Ni and cleanliness enhancement, it is helpful to regulate the Al content. Aluminum is a deoxidizing element that is not only added to stainless steel but is also incorporated in scrap, slag etc. It forms hard oxide-system inclusions composed mainly of alumina. These hard inclusions are crushed into fine pieces only after the foil has been reduced to a small thickness by rolling. Inclusion-rich regions are therefore formed only at certain portions of the foil and become a cause of voids. Total suppression of voids and cracking requires the amount of Al addition to be made 0.0030% or less.

Addition of Cu and Ti to the ultrathin stainless steel foil reduces voids and cracking by lowering the solubility in acidic etchant of sulfide inclusions composed mainly of MnS.

By improving the corrosion resistance of the ultrathin stainless steel foil, Mo, W and V upgrade the durability of the component produced by etching the foil and also work to prevent occurrence of voids and cracks at the edges during etching. At least one of Cu, Ti, Mo, W and V is added in accordance with necessity. No marked effect is obtained at a low amount of addition, while excess addition does not produce an increase in effect proportional to the increase in cost. Therefore, Cu content is defined as 0.15% to 4%, Ti content as 0.05% to 2%, Mo content as 3% to 6.5%, W as 0.3% to 6.5%, and V as 0.3% to 6.5%.

The invention will now be explained in detail with reference to working examples.

EXAMPLE 1

Stainless steels of the chemical compositions shown in Table 1 were melted and cast using a vacuum furnace, hot rolled, annealed and pickled, cold rolled, and annealed and pickled, whereafter they were foil-rolled to various thicknesses. Table 1 shows the inclusion densities (number/mm$^2$) observed with a scanning electron microscope (2,000× magnification, 60 fields) and the proximity of inclusions of a major diameter of 5 μm or greater determined by imputting images observed with an optical microscope (200 magnifications, 60 fields) to a full color image processing system. The maximum proximity was defined as distance between the centers (centers of gravity) of the inclusions. The foils marked with * in the No. column are comparative examples falling outside the range of invention. The state of inclusion dispersion was varied by varying the period between termination of steel melt stirring and casting and by varying the difference between the solidification starting temperature and the casting temperature.

number of voids per 1 mm$^2$ (density), is shown in Table 1. Ten test pieces were prepared for each steel and examined after etching. The results for each steel shown in Table 1 are the averages for the ten pieces. The results of echability evaluation is also shown in the table, with a void density (number/mm$^2$) of 0 being rated as excellent ⊙), of greater that 0 but not greater than 1.0 as good (○), and of greater than 1.0 as poor (x).

Figure 2:
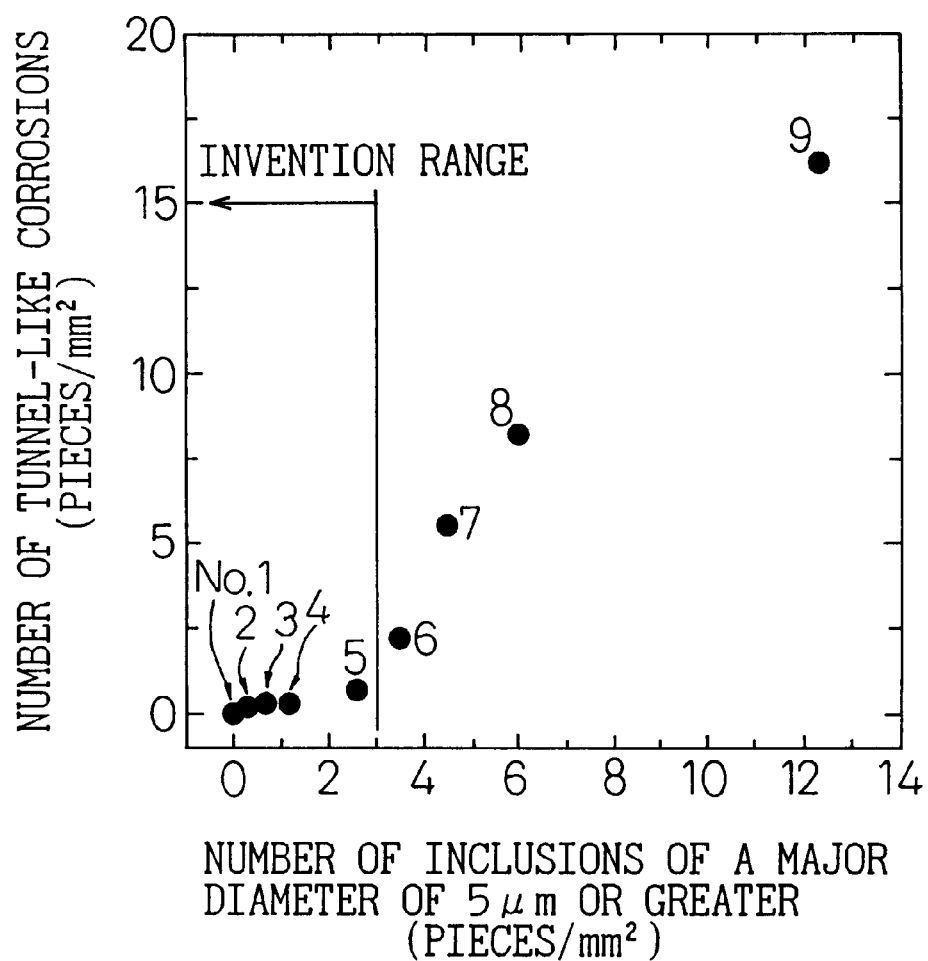
FIG. 2 is a graph showing how the density of inclusions of a major diameter of 5 $\mu$m or greater (number per $mm^2$) affects the number of voids.

Foils No. 1–9 were examined for the effect of density (number/mm$^2$) of inclusions of a major diameter of 5 μm or greater. As shown by the data plotted in FIG. 2, the rate of void occurrence can be decreased by reducing the number of inclusions of a major diameter of 5 μm or greater. In particular, void occurrence can be very greatly decreased by keeping the number of inclusions of a major diameter of 5 μm or greater to 3/mm$^2$ or less.

Although Foils No. 6–9 (comparative examples) satisfied the relationship regarding S and O content of Japanese Unexamined Patent Publication No. 60(1985)-92449, which teaches that the number of etching pits can be reduced to 30/15 mm$^2$ by satisfying the relationship of (S ppm)<42−0.094 (O ppm), they exhibited a high rate of void occurrence. On the other hand, in Foils No. 1–5 (invention examples reduced in number of inclusions) void occurrence could be suppressed. This shows that the S and O reduction of the prior art is incapable of preventing void occurrence in an ultrathin stainless steel foil of a thickness of 25 μm or less. Foils No. 6a–6d had the same chemical composition but different thicknesses. The foils of greater than 25 μm

TABLE 1

| No. | C | Si | Mn | P | S | Ni | Cr | O | Inclusions of diameter of 5 μm or greater | | Thickness (μm) | Number of tunnel-like corrosions per mm$^2$ | Rating |
| | | | | | | | | | Number per mm$^2$ | Maximum proximity (mm) | | | |
|---|---|---|---|---|---|---|---|---|---|---|---|---|---|
| 1 | 0.040 | 0.48 | 0.92 | 0.030 | 0.0032 | 9.02 | 18.03 | 0.0036 | 0 | 0.23 | 20 | 0 | ⊙ |
| 2 | 0.042 | 0.50 | 0.89 | 0.031 | 0.0033 | 8.99 | 18.08 | 0.0036 | 0.3 | 0.25 | 20 | 0.2 | ○ |
| 3 | 0.042 | 0.52 | 0.90 | 0.032 | 0.0035 | 8.99 | 18.02 | 0.0033 | 0.7 | 0.22 | 20 | 0.3 | ○ |
| 4 | 0.041 | 0.48 | 0.90 | 0.031 | 0.0032 | 9.00 | 17.98 | 0.0034 | 1.2 | 0.28 | 20 | 0.3 | ○ |
| 5 | 0.040 | 0.49 | 0.91 | 0.033 | 0.0031 | 9.02 | 18.10 | 0.0038 | 2.6 | 0.23 | 20 | 0.7 | ○ |
| 6* | 0.042 | 0.50 | 0.91 | 0.031 | 0.0033 | 9.01 | 17.99 | 0.0040 | 3.5 | 0.22 | 20 | 2.2 | x |
| 7* | 0.042 | 0.50 | 0.90 | 0.032 | 0.0031 | 9.02 | 18.02 | 0.0040 | 4.5 | 0.21 | 20 | 5.5 | x |
| 8* | 0.042 | 0.48 | 0.91 | 0.032 | 0.0035 | 9.01 | 18.02 | 0.0044 | 6.0 | 0.22 | 20 | 8.2 | x |
| 9* | 0.040 | 0.48 | 0.90 | 0.032 | 0.0037 | 8.99 | 18.00 | 0.0052 | 12.3 | 0.20 | 20 | 16.2 | x |
| 6a* | 0.042 | 0.50 | 0.91 | 0.031 | 0.0033 | 9.01 | 17.99 | 0.0040 | 3.5 | 0.21 | 10 | 3.5 | x |
| 6b* | " | " | " | " | " | " | " | " | 3.5 | 0.22 | 18 | 1.6 | x |
| 6c* | " | " | " | " | " | " | " | " | 4.2 | 0.28 | 45 | 0.8 | ○ |
| 6d* | " | " | " | " | " | " | " | " | 5.5 | 0.28 | 65 | 0 | ⊙ |
| 10 | 0.041 | 0.48 | 0.90 | 0.030 | 0.0036 | 9.01 | 18.03 | 0.0040 | 0.3 | 0.09 | 20 | 0.5 | ○ |
| 11 | 0.039 | 0.45 | 0.92 | 0.031 | 0.0037 | 9.02 | 18.05 | 0.0040 | 0.4 | 0.23 | 20 | 0.2 | ○ |
| 12 | 0.042 | 0.46 | 0.88 | 0.032 | 0.0038 | 9.01 | 18.02 | 0.0035 | 0.3 | 0.58 | 20 | 0 | ⊙ |
| 13 | 0.044 | 0.49 | 0.91 | 0.030 | 0.0038 | 8.98 | 18.01 | 0.0035 | 0.3 | 0.89 | 20 | 0 | ⊙ |
| 14 | 0.045 | 0.51 | 0.80 | 0.030 | 0.0036 | 8.98 | 18.00 | 0.0030 | 0.4 | 1.20 | 20 | 0 | ⊙ |

*Indicates comparative example.

As shown in FIG. 1, the produced foils were coated with photoresist, exposed, developed and thereafter etched by spraying with a 100 g/l aqueous solution (30° C.) of FeCl$_3$·6H$_2$O adjusted to a Ph of 0 with HCl. Edge surfaces A and B formed perpendicularly to the rolling direction by etching were observed with a scanning electron microscope (2,000×magnification) to determine the number of voids. Only tunnel-like corrosions passing from the edge surface A to the edge surface B were counted as voids and etching pits and corrosions occurring at only one of the end surfaces were omitted from the count. The void count, expressed as thickness did not readily experience void occurrence even if they did not fall within the range of the present invention regarding presence of inclusions of a major diameter greater than 5 μm. It will be noted, however, that those of a thickness of less than 25 μm were susceptible to void occurrence.

Figure 3:
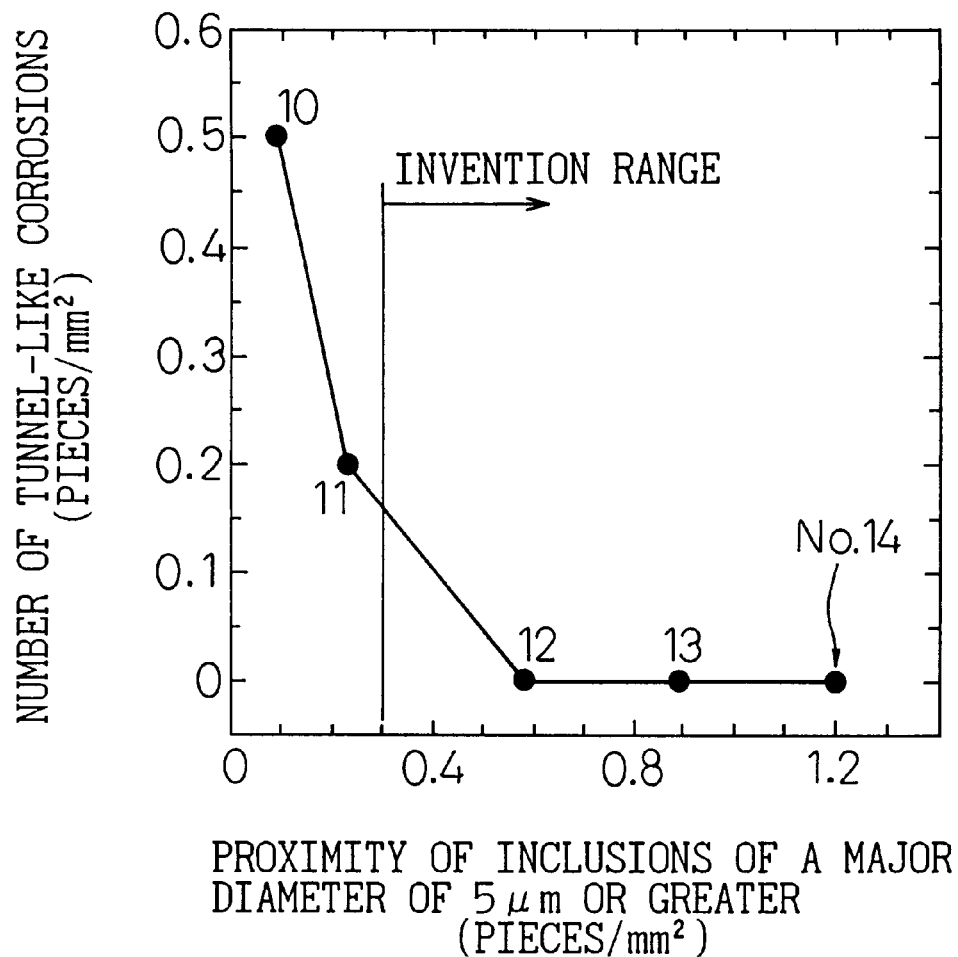
FIG. 3 is a graph showing how the proximity of inclusions of a major diameter of 5 $\mu$m or greater affects the number of voids.

Foils No. 10–14, in which the density (number/mm$^2$) of inclusions of a major diameter of 5 μm or greater was 3 or less, were observed for effect of proximity of the inclusion of a major diameter of 5 μm or greater. As shown by the data plotted in FIG. 3, the rate of void occurrence decreased with increasing maximum proximity.

TABLE 2

| No. | C | Si | Mn | P | S | Ni | Cr | Al | O | Cleanliness (%) | Thickness (μm) | Number of tunnel-like corrosions per mm$^2$ | Rating |
|---|---|---|---|---|---|---|---|---|---|---|---|---|---|
| 1 | 0.042 | 0.48 | 0.90 | 0.031 | 0.0002 | 9.02 | 18.03 | 0.0035 | 0.0036 | 0.0030 | 20 | 0 | ⊚ |
| 2 | 0.046 | 0.51 | 0.89 | 0.032 | 0.0005 | 9.00 | 18.04 | 0.0035 | 0.0044 | 0.0029 | 20 | 0 | ⊚ |
| 3 | 0.042 | 0.52 | 0.89 | 0.032 | 0.0012 | 8.99 | 18.01 | 0.0035 | 0.0040 | 0.0032 | 20 | 0.3 | ○ |
| 4 | 0.047 | 0.48 | 0.89 | 0.031 | 0.0017 | 9.00 | 18.02 | 0.0032 | 0.0037 | 0.0031 | 20 | 0.3 | ○ |
| 5 | 0.042 | 0.52 | 0.83 | 0.033 | 0.0025 | 9.02 | 18.01 | 0.0032 | 0.0040 | 0.0031 | 20 | 0.5 | ○ |
| 6 | 0.044 | 0.50 | 0.85 | 0.033 | 0.0028 | 9.01 | 18.03 | 0.0035 | 0.0039 | 0.0029 | 20 | 0.6 | ○ |
| 7* | 0.045 | 0.51 | 0.86 | 0.034 | 0.0035 | 9.01 | 18.02 | 0.0035 | 0.0036 | 0.0032 | 20 | 2.2 | x |
| 8* | 0.045 | 0.51 | 0.85 | 0.032 | 0.0042 | 9.01 | 17.99 | 0.0035 | 0.0036 | 0.0036 | 20 | 5.3 | x |
| 9* | 0.046 | 0.50 | 0.86 | 0.033 | 0.0053 | 9.02 | 17.98 | 0.0036 | 0.0036 | 0.0035 | 20 | 7.6 | x |
| 10* | 0.045 | 0.51 | 0.88 | 0.032 | 0.0066 | 9.01 | 18.00 | 0.0034 | 0.0041 | 0.0036 | 20 | 18.0 | x |
| 11* | 0.045 | 0.55 | 0.88 | 0.033 | 0.0017 | 0.15 | 18.00 | 0.0035 | 0.0033 | 0.0029 | 20 | 6.2 | x |
| 12* | 0.045 | 0.48 | 0.89 | 0.034 | 0.0018 | 2.10 | 18.01 | 0.0036 | 0.0035 | 0.0031 | 20 | 4.3 | x |
| 13 | 0.046 | 0.48 | 0.89 | 0.035 | 0.0017 | 5.61 | 18.02 | 0.0035 | 0.0038 | 0.0029 | 20 | 0.7 | ○ |
| 14 | 0.044 | 0.49 | 0.88 | 0.032 | 0.0016 | 7.21 | 18.00 | 0.0036 | 0.0040 | 0.0033 | 20 | 0.3 | ○ |
| 15 | 0.045 | 0.49 | 0.86 | 0.031 | 0.0017 | 12.12 | 18.00 | 0.0035 | 0.0038 | 0.0032 | 20 | 0.1 | ○ |
| 16 | 0.044 | 0.45 | 0.85 | 0.033 | 0.0017 | 18.35 | 17.98 | 0.0035 | 0.0039 | 0.0034 | 20 | 0.1 | ○ |
| 17 | 0.043 | 0.51 | 0.89 | 0.035 | 0.0018 | 23.52 | 17.99 | 0.0034 | 0.0042 | 0.0032 | 20 | 0.1 | ○ |
| 18 | 0.042 | 0.52 | 0.89 | 0.032 | 0.0017 | 28.55 | 18.02 | 0.0035 | 0.0040 | 0.0033 | 20 | 0.1 | ○ |
| 19 | 0.042 | 0.48 | 0.88 | 0.033 | 0.0016 | 9.01 | 18.00 | 0.0031 | 0.0041 | 0.0003 | 20 | 0.1 | ○ |
| 20 | 0.044 | 0.49 | 0.89 | 0.034 | 0.0016 | 9.02 | 18.01 | 0.0032 | 0.0038 | 0.0015 | 20 | 0.1 | ○ |
| 21 | 0.043 | 0.48 | 0.88 | 0.035 | 0.0017 | 9.02 | 18.01 | 0.0035 | 0.0045 | 0.0045 | 20 | 0.8 | ○ |
| 22* | 0.045 | 0.51 | 0.89 | 0.033 | 0.0018 | 9.01 | 18.00 | 0.0032 | 0.0055 | 0.0065 | 20 | 5.5 | x |
| 23* | 0.045 | 0.50 | 0.90 | 0.033 | 0.0017 | 9.01 | 18.02 | 0.0035 | 0.0064 | 0.0082 | 20 | 12.8 | x |

TABLE 3

| No. | C | Si | Mn | P | S | Ni | Cr | Al | O | Cleanliness (%) | Thickness (μm) | Number of tunnel-like corrosions per mm$^2$ | Rating |
|---|---|---|---|---|---|---|---|---|---|---|---|---|---|
| 24* | 0.046 | 0.50 | 0.86 | 0.033 | 0.0053 | 9.02 | 17.98 | 0.0036 | 0.0036 | 0.0033 | 10 | 9.2 | x |
| 25* | " | " | " | " | " | " | " | " | " | 0.0035 | 50 | 2.3 | x |
| 26* | " | " | " | " | " | " | " | " | " | 0.0031 | 75 | 0.4 | ○ |
| 27* | " | " | " | " | " | " | " | " | " | 0.0033 | 100 | 0.1 | ○ |
| 28* | 0.045 | 0.55 | 0.88 | 0.033 | 0.0017 | 0.15 | 18.00 | 0.0035 | 0.0033 | 0.0031 | 10 | 8.3 | x |
| 29* | " | " | " | " | " | " | " | " | " | 0.0035 | 50 | 4.2 | x |
| 30* | " | " | " | " | " | " | " | " | " | 0.0033 | 75 | 0.3 | ○ |
| 31* | " | " | " | " | " | " | " | " | " | 0.0030 | 100 | 0.1 | ○ |
| 32 | 0.047 | 0.48 | 0.89 | 0.031 | 0.0017 | 9.00 | 18.02 | 0.0032 | 0.0037 | 0.0031 | 10 | 0.4 | ○ |
| 33 | " | " | " | " | " | " | " | " | " | 0.0032 | 50 | 0.3 | ○ |
| 34 | " | " | " | " | " | " | " | " | " | 0.0033 | 75 | 0.2 | ○ |
| 35 | " | " | " | " | " | " | " | " | " | 0.0032 | 100 | 0.1 | ○ |
| 36 | 0.045 | 0.51 | 0.89 | 0.034 | 0.0017 | 9.01 | 18.01 | 0.0012 | 0.0040 | 0.0032 | 20 | 0 | ⊚ |
| 37 | 0.045 | 0.51 | 0.88 | 0.032 | 0.0016 | 12.01 | 18.02 | 0.0010 | 0.0042 | 0.0031 | 20 | 0 | ⊚ |

*Indicates comparative example.

EXAMPLE 2

Stainless steels of the chemical compositions shown in Tables 2 and 3 were melted and cast using a vacuum furnace, hot rolled, annealed and pickled, cold rolled, and annealed and pickled, whereafter they were foil-rolled to various thicknesses. In accordance with JIS G 0555, a sectional surface of each foil lying parallel to the foil rolling direction was polished to a mirror finish and examined for cleanliness using a scanning electron microscope (400×magnification, 60 fields). The results are shown in the tables. The foils marked with * in the No. column are comparative examples falling outside the range of invention. The produced foils were evaluated by counting the number of voids (tunnel-like corrosions) by the method of Example 1.

Figure 4:
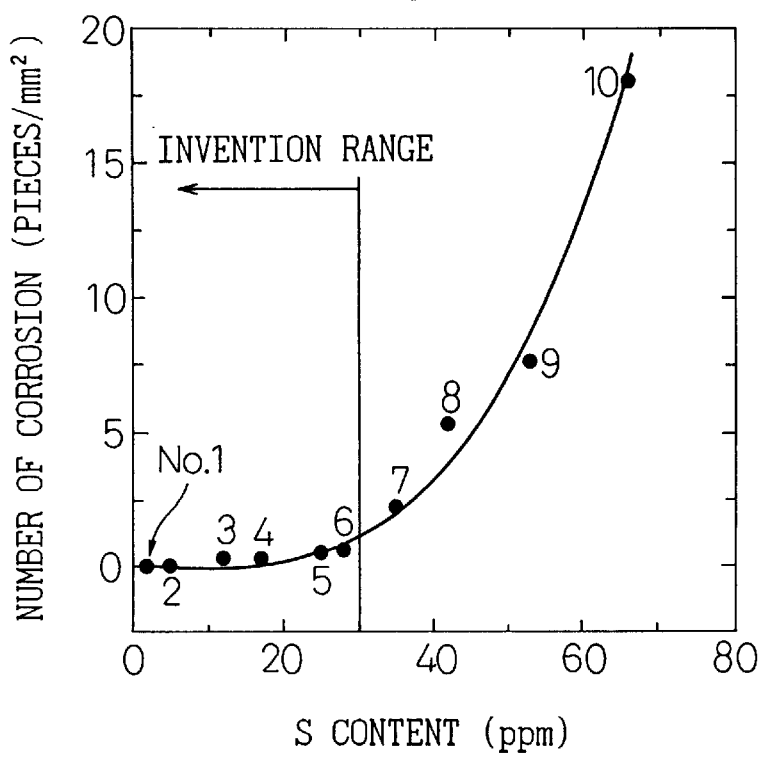
FIG. 4 is a graph showing how the number of voids occurring varies with S content.

Among the test pieces prepared, those of Foils No. 1–10 were varied in S content. As shown in FIG. 4, the number of voids (tunnel-like corrosions) could be markedly reduced by lowering S content to 0.0030% or less. The present invention therefore defines S content as 0.0030% or less.

Figure 5:
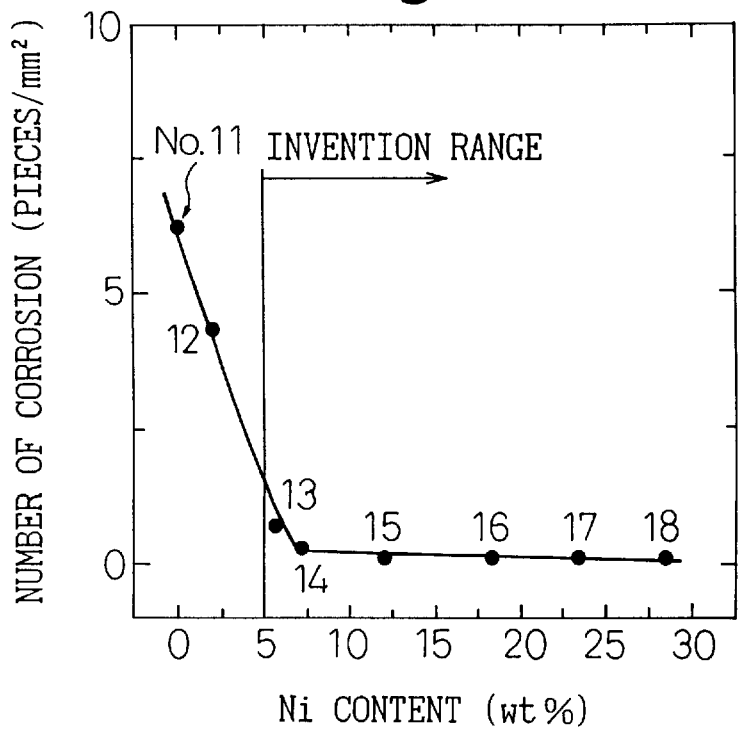
FIG. 5 is a graph showing how the number of voids occurring varies with Ni content.

Foils No. 11–18 had a S content of around 0.0017% and were varied in amount of added Ni. As shown in FIG. 5, a marked reduction in the number of voids was realized when the amount Ni added was 5% or greater. This effect of Ni saturated at about 12%. This means that excessive Ni addition is liable to simply increase starting material and production cost without providing a proportional improvement in performance. The present invention therefore defines the amount of Ni addition as 5.0%–30%.

Figure 6:
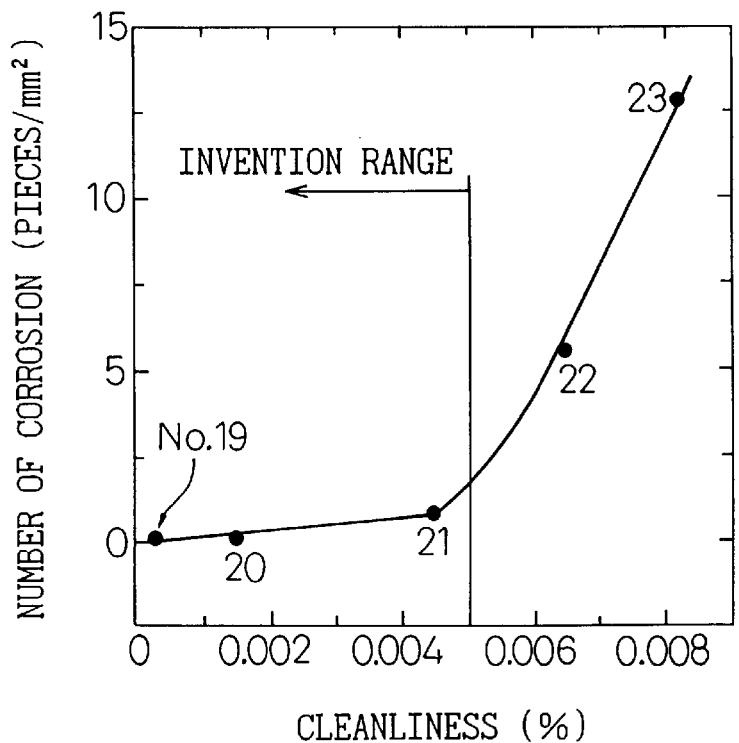
FIG. 6 is a graph showing how the number of voids occurring varies with cleanliness.

Foils No. 19–23 were compared for result of differing cleanliness. As shown in FIG. 6, the number of voids fell sharply to low values at and below a cleanliness of 0.005%.

Figure 7:
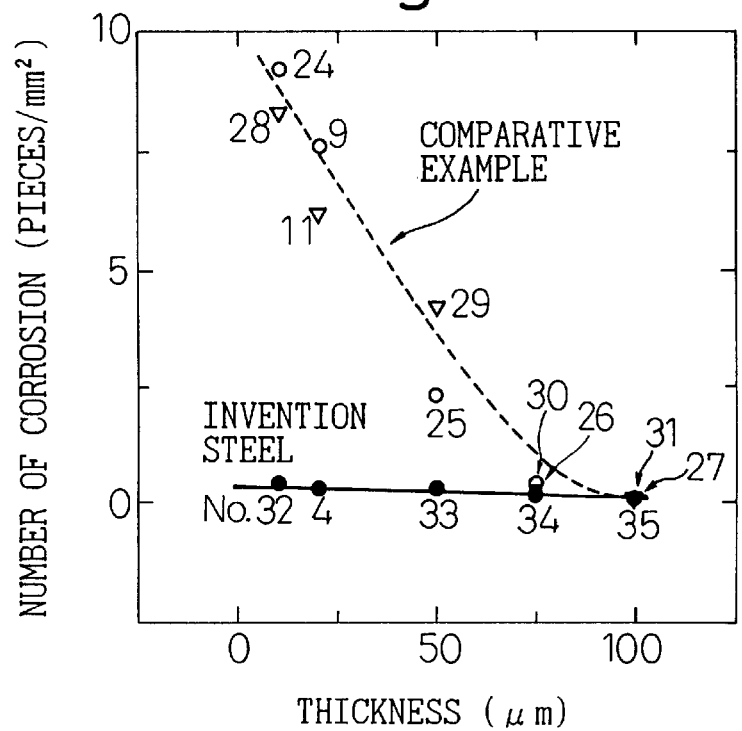
FIG. 7 is a graph showing how the number of voids occurring varies with foil thickness.

Foils No. 24–27 and No. 28–31 were investigated for effect of foil thickness. Foils No. 24–27 contained about 9% of Ni but had high S contents exceeding the range of the present invention. Foils No. 28–31 had S contents within the invention range but Ni contents of less than 5.0%. As can be seen from FIG. 7, foils of steels whose S and Ni contents were outside the invention ranges exhibited pronounced void occurrence at thicknesses of 25 μm or less. Although Foils No. 28–31 satisfied the relationship of (S ppm)<42–0.094 (O ppm) taught by Japanese Unexamined Patent Publication No. 60(1985)-92449, they exhibited a high rate of void occurrence owing to the small thickness. On the other hand, in Foils No. 4 and No. 32–35 having S content of 0.0030% or less and added with 5.0% or greater of Ni, were resistant to void occurrence.

Foils No. 36 and 37 are made of steels reduced in amount of added Al. It was found that when Al was reduced to 0.0030% or less as in these examples, voids could be totally eliminated.

EXAMPLE 3

Stainless steels of the chemical compositions shown in Tables 4 and 5 were melted and cast using a vacuum furnace. After ordinary hot rolling, annealing and pickling, cold rolling, and annealing and pickling, they were foil-rolled to various thicknesses. Each produced foil was evaluated by the method of Example 2. All foils had a thickness of 20 μm.

TABLE 4

| No. | C | Si | Mn | P | S | Ni | Cr | Cu | Ti | Al | Mo | W | V | Cleanliness (%) | Number of tunnel-like corrosions per mm$^2$ | Rating |
|---|---|---|---|---|---|---|---|---|---|---|---|---|---|---|---|---|
| 1 | 0.040 | 0.48 | 0.92 | 0.030 | 0.0022 | 9.02 | 18.03 | 0.02 | — | 0.0036 | — | — | — | 0.0032 | 0.7 | ○ |
| 2 | 0.041 | 0.48 | 0.90 | 0.029 | 0.0020 | 9.01 | 18.03 | 0.10 | — | 0.0035 | — | — | — | 0.0033 | 0.5 | ○ |
| 3 | 0.042 | 0.45 | 0.89 | 0.028 | 0.0029 | 9.03 | 18.01 | 0.17 | — | 0.0033 | — | — | — | 0.0032 | 0.3 | ○ |
| 4 | 0.040 | 0.46 | 0.88 | 0.030 | 0.0022 | 9.00 | 18.03 | 0.25 | — | 0.0033 | — | — | — | 0.0033 | 0.1 | ○ |
| 5 | 0.041 | 0.48 | 0.87 | 0.031 | 0.0020 | 8.97 | 18.02 | 1.32 | — | 0.0034 | — | — | — | 0.0033 | 0.1 | ○ |
| 6 | 0.041 | 0.43 | 0.92 | 0.030 | 0.0028 | 8.98 | 17.98 | 2.45 | — | 0.0033 | — | — | — | 0.0032 | 0.1 | ○ |
| 7 | 0.040 | 0.43 | 0.95 | 0.030 | 0.0027 | 8.99 | 18.03 | 3.88 | — | 0.0032 | — | — | — | 0.0029 | 0.1 | ○ |
| 10 | 0.042 | 0.43 | 0.95 | 0.030 | 0.0020 | 9.02 | 18.00 | — | 0.01 | 0.0035 | — | — | — | 0.0028 | 0.8 | ○ |
| 11 | 0.045 | 0.44 | 0.98 | 0.031 | 0.0020 | 9.05 | 17.98 | — | 0.07 | 0.0033 | — | — | — | 0.0027 | 0.2 | ○ |
| 12 | 0.043 | 0.45 | 0.95 | 0.030 | 0.0021 | 9.03 | 17.99 | — | 0.12 | 0.0035 | — | — | — | 0.0029 | 0.1 | ○ |
| 13 | 0.044 | 0.43 | 0.92 | 0.030 | 0.0023 | 9.01 | 18.03 | — | 0.25 | 0.0032 | — | — | — | 0.0033 | 0.1 | ○ |
| 14 | 0.044 | 0.42 | 0.93 | 0.030 | 0.0020 | 9.00 | 18.02 | — | 0.86 | 0.0033 | — | — | — | 0.0032 | 0.1 | ○ |
| 15 | 0.041 | 0.48 | 0.92 | 0.032 | 0.0028 | 8.92 | 18.05 | — | 1.28 | 0.0033 | — | — | — | 0.0032 | 0.1 | ○ |
| 16 | 0.041 | 0.43 | 0.94 | 0.029 | 0.0026 | 8.99 | 18.02 | — | 1.95 | 0.0033 | — | — | — | 0.0031 | 0.1 | ○ |
| 17 | 0.039 | 0.42 | 0.95 | 0.029 | 0.0025 | 8.92 | 17.86 | 0.85 | 0.25 | 0.0032 | — | — | — | 0.0035 | 0.1 | ○ |
| 18 | 0.038 | 0.45 | 0.93 | 0.031 | 0.0022 | 9.02 | 17.89 | 1.23 | 0.85 | 0.0032 | — | — | — | 0.0032 | 0.1 | ○ |
| 19 | 0.042 | 0.48 | 0.82 | 0.030 | 0.0021 | 9.03 | 18.02 | 0.10 | — | 0.0025 | — | — | — | 0.0033 | 0.2 | ○ |
| 20 | 0.041 | 0.43 | 0.83 | 0.030 | 0.0020 | 9.01 | 18.03 | 0.25 | — | 0.0028 | — | — | — | 0.0030 | 0.1 | ○ |
| 21 | 0.044 | 0.45 | 0.84 | 0.030 | 0.0021 | 9.03 | 18.00 | 0.66 | — | 0.0023 | — | — | — | 0.0029 | 0 | ◎ |
| 22 | 0.039 | 0.48 | 0.82 | 0.032 | 0.0025 | 9.02 | 18.03 | — | 0.03 | 0.0025 | — | — | — | 0.0033 | 0.2 | ○ |
| 23 | 0.041 | 0.45 | 0.88 | 0.33 | 0.0025 | 9.02 | 18.03 | — | 0.10 | 0.0022 | — | — | — | 0.0032 | 0 | ◎ |
| 24 | 0.041 | 0.46 | 0.81 | 0.029 | 0.0027 | 8.99 | 17.99 | — | 0.25 | 0.0024 | — | — | — | 0.0033 | 0 | ◎ |
| 25 | 0.039 | 0.46 | 0.82 | 0.029 | 0.0025 | 8.98 | 17.99 | 0.55 | 0.10 | 0.0022 | — | — | — | 0.0033 | 0 | ◎ |

TABLE 5

| No. | C | Si | Mn | P | S | Ni | Cr | Cu | Ti | Al | Mo | W | V | Cleanliness (%) | Number of tunnel-like corrosions per mm$^2$ | Rating |
|---|---|---|---|---|---|---|---|---|---|---|---|---|---|---|---|---|
| 26 | 0.040 | 0.46 | 0.80 | 0.030 | 0.0022 | 9.01 | 18.00 | 0.25 | — | 0.0035 | 0.05 | — | — | 0.0029 | 0.1 | ○ |
| 27 | 0.042 | 0.45 | 0.80 | 0.029 | 0.0022 | 8.99 | 18.00 | 0.25 | — | 0.0034 | 0.12 | — | — | 0.0028 | 0.1 | ○ |
| 28 | 0.044 | 0.44 | 0.81 | 0.031 | 0.0023 | 9.00 | 17.98 | 0.26 | — | 0.0036 | 0.33 | — | — | 0.0028 | 0 | ◎ |
| 29 | 0.039 | 0.44 | 0.82 | 0.033 | 0.0025 | 9.02 | 18.00 | 0.24 | — | 0.0035 | 1.52 | — | — | 0.0029 | 0 | ◎ |
| 30 | 0.038 | 0.42 | 0.83 | 0.032 | 0.0024 | 9.01 | 18.01 | 0.25 | — | 0.0034 | 3.45 | — | — | 0.0028 | 0 | ◎ |
| 31 | 0.036 | 0.46 | 0.80 | 0.031 | 0.0022 | 8.98 | 17.98 | 0.26 | — | 0.0035 | 6.25 | — | — | 0.0029 | 0 | ◎ |
| 32 | 0.040 | 0.48 | 0.81 | 0.030 | 0.0020 | 9.99 | 18.02 | 0.25 | — | 0.0034 | — | 0.11 | — | 0.0030 | 0.1 | ○ |
| 33 | 0.042 | 0.51 | 0.81 | 0.029 | 0.0021 | 9.02 | 18.03 | 0.26 | — | 0.0032 | — | 0.38 | — | 0.0031 | 0 | ◎ |
| 34 | 0.044 | 0.39 | 0.81 | 0.028 | 0.0020 | 8.99 | 18.01 | 0.27 | — | 0.0035 | — | 1.63 | — | 0.0032 | 0 | ◎ |
| 35 | 0.045 | 0.42 | 0.82 | 0.029 | 0.0029 | 8.89 | 17.98 | 0.25 | — | 0.0035 | — | — | 0.10 | 0.0029 | 0.1 | ○ |
| 36 | 0.042 | 0.41 | 0.83 | 0.029 | 0.0029 | 8.97 | 17.99 | 0.25 | — | 0.0035 | — | — | 0.37 | 0.0028 | 0 | ◎ |
| 37 | 0.040 | 0.41 | 0.82 | 0.031 | 0.0022 | 9.02 | 17.98 | 0.25 | — | 0.0032 | — | — | 1.89 | 0.0029 | 0 | ◎ |
| 38 | 0.040 | 0.43 | 0.79 | 0.030 | 0.0024 | 9.02 | 18.01 | 0.27 | — | 0.0035 | 0.45 | 0.50 | — | 0.0029 | 0 | ◎ |
| 39 | 0.040 | 0.42 | 0.78 | 0.030 | 0.0021 | 9.00 | 18.00 | 0.26 | — | 0.0034 | — | 0.45 | 0.44 | 0.0028 | 0 | ◎ |
| 40 | 0.041 | 0.40 | 0.79 | 0.030 | 0.0023 | 8.98 | 18.02 | 0.25 | — | 0.0035 | 0.48 | — | 0.52 | 0.0029 | 0 | ◎ |
| 41 | 0.041 | 0.50 | 0.83 | 0.031 | 0.0029 | 9.02 | 18.03 | 0.25 | — | 0.0033 | 0.40 | 0.42 | 0.45 | 0.0025 | 0 | ◎ |
| 42 | 0.042 | 0.51 | 0.72 | 0.031 | 0.0029 | 8.89 | 18.03 | — | — | 0.0025 | 0.45 | 0.50 | — | 0.0023 | 0 | ◎ |
| 43 | 0.044 | 0.52 | 0.75 | 0.033 | 0.0027 | 8.88 | 18.03 | — | — | 0.0022 | — | 0.45 | 0.44 | 0.0028 | 0 | ◎ |
| 44 | 0.042 | 0.50 | 0.77 | 0.032 | 0.0025 | 8.87 | 18.00 | — | — | 0.0022 | 0.48 | — | 0.52 | 0.0029 | 0 | ◎ |
| 45 | 0.044 | 0.50 | 0.78 | 0.033 | 0.0026 | 8.86 | 18.01 | — | — | 0.0025 | 0.40 | 0.42 | 0.45 | 0.0028 | 0 | ◎ |
| 46 | 0.044 | 0.50 | 0.75 | 0.033 | 0.0027 | 8.87 | 18.00 | 0.22 | — | 0.0026 | 0.41 | 0.43 | 0.42 | 0.0029 | 0 | ◎ |

Foils No. 1–7 were examined only for effect of Cu addition. Addition of Cu reduced the number of voids. Foils No. 10–16 were examined only for effect of Ti addition. Like Cu, Ti was also found to suppress void occurrence. Cu and Ti, in combination, were added to foils No. 17 and 18. Addition of Ti in combination with Cu decreased the number of corrosions compared with the case of Foils No. 13 and 14 added with about the same amount of Ti. Foils No. 19–25 were controlled to 0.0030% of Al and examined for effect of Cu and Ti addition. When Al content was held to a low value, voids could be totally eliminated by addition of Cu and/or Ti.

Foils No. 26–46 were examined for effect of Mo, W and V. Foils No. 26–41 contained Al in excess of 0.0030% and Foils No. 42–46 contained Al at 0.0030% or less. In all cases, the number of voids became 0 when Mo content was 0.3% or greater, W content was 0.3% or greater or V content was 0.3% or greater. Voids were also totally eliminated when these elements were added in combination.

This invention enables production of ultrathin stainless steel foils not readily susceptible to the voids (tunnel-like corrosions) that have occasionally occurred during etching, together with cracking in the rolling direction from the edges, and makes it possible to supply inexpensive electronic and machine components, including hard disk suspensions, printed circuit boards, picture tube shadow masks, lead frames, precision microsprings, precision vibrator plates, printer types, cutting dies, etc.

What is claimed is:

1. An ultrathin stainless steel foil of a thickness of 25 $\mu$m or less whose average number of inclusions of a major diameter of 5 $\mu$m or greater per 1 $mm^2$ in sections along the rolling direction is 3 or less.

2. An ultrathin stainless steel foil according to claim 1, wherein proximity between the inclusions of a major diameter of 5 $\mu$m or greater is 0.3 mm or greater.

3. An ultrathin stainless steel foil of a thickness of 25 $\mu$m or less according to claim 1, wherein the ultrathin stainless steel foil comprises, in wt %, 5% to 30% of Ni and S of 0.0030% or less as impurity, and has cleanliness as defined by JIS G 0555 of 0.005% or less.

4. An ultrathin stainless steel foil according to claim 3, further comprising, in wt %, 0.0030% or less of Al.

5. An ultrathin stainless steel foil according to claim 3, further comprising, in wt %, one or more of 0.15% to 4% of Cu, 0.05% to 2% of Ti, 0.3% to 6.5% of Mo, 0.3% to 6.5% or W and 0.3% to 6.5% of V.

* * * * *